(12) United States Patent
Koinuma et al.

(10) Patent No.: US 9,157,144 B2
(45) Date of Patent: Oct. 13, 2015

(54) MASKING MECHANISM FOR FILM FORMING APPARATUS

(75) Inventors: Hideomi Koinuma, Tokyo (JP); Yukio Yamamoto, Kanagawa (JP); Yuji Matsumoto, Kanagawa (JP); Ryota Takahashi, Tokyo (JP)

(73) Assignee: JAPAN SCIENCE AND TECHNOLOGY AGENCY, Saitama (JP)

( * ) Notice: Subject to any disclaimer, the term of this patent is extended or adjusted under 35 U.S.C. 154(b) by 902 days.

(21) Appl. No.: 12/652,340

(22) Filed: Jan. 5, 2010

(65) Prior Publication Data
US 2010/0151128 A1 Jun. 17, 2010

Related U.S. Application Data

(62) Division of application No. 10/528,265, filed as application No. PCT/JP03/11950 on Sep. 19, 2003, now abandoned.

(30) Foreign Application Priority Data

Sep. 20, 2002 (JP) ................. 2002-275365

(51) Int. Cl.
*C23C 16/00* (2006.01)
*C23C 14/04* (2006.01)

(52) U.S. Cl.
CPC .................... *C23C 14/044* (2013.01)

(58) Field of Classification Search
CPC ..................................... C23C 14/044
USPC ........................... 427/248.1–255.7
See application file for complete search history.

(56) References Cited

U.S. PATENT DOCUMENTS

| 2,433,635 A | 12/1947 | Sukumlyn |
| 3,131,078 A | 4/1964 | Fuller et al. |
| 6,911,129 B1 * | 6/2005 | Li ................ 204/298.11 |

(Continued)

FOREIGN PATENT DOCUMENTS

| JP | 43-27926 B1 | 12/1968 |
| JP | 49-42155-01 U | 4/1974 |
| JP | 49-34573 B1 | 9/1974 |

(Continued)

OTHER PUBLICATIONS

European Search Report dated Dec. 19, 2008 issued in corresponding Application No. 03797681.8.

(Continued)

*Primary Examiner* — Michael Wieczorek
*Assistant Examiner* — Michael G Miller
(74) *Attorney, Agent, or Firm* — Westerman, Hattori, Daniels & Adrian, LLP

(57) ABSTRACT

It comprises a mask (11) having a first, a second and a third action edge (11*a*, 11*b*, 11*c*), and a drive means for moving the mask (11) relative to a substrate (12) in a uniaxial direction (A) whereby moving the mask at a fixed rate of movement to cause the edges to successively act on an identical substrate region while successively applying different materials thereto forms thin films of three components successively with respective film thickness gradients oriented in three different directions mutually angularly spaced apart by an angle of 120° to allow these films to overlap, thereby forming a ternary phase diagrammatic thin film 13.

4 Claims, 23 Drawing Sheets

(56) References Cited

U.S. PATENT DOCUMENTS

2005/0166850 A1  8/2005  Li
2006/0057240 A1  3/2006  Koinuma et al.

FOREIGN PATENT DOCUMENTS

JP  60-181264 A  9/1985
JP  2004-35983 A  2/2004

OTHER PUBLICATIONS

C. J. Bowler and R. D. Gould, "A sequential masking system for the deposition of multilayer thin-film structures" Journal of Vacuum Science Technology, 1987, pp. 114-115, XP001308318 Woodbury, NY, USA.

Earl Danielson et al, "A combinatorial approach to the discovery and optimization of luminescent materials" Nature, Oct. 30, 1997, vol. 389, pp. 944-948.

X.-D. Xiang et al., "A combinatorial approach to materials discovery" Science, Jun. 23, 1995, vol. 268, pp. 1738-1740.

Hideomi Koinuma, "Combinatorial materials research projects in Japan" Applied Surface Science, Apr. 28, 2002, vol. 189, pp. 179-187.

Yuji Matsumoto, "Advance combinatorial thin film technology for new functional materials" Tokyo, Japan, Mar. 27, 2003, No. 0, p. 16.

International Search Report of PCT/JP03/11950, mailing date of Nov. 4, 2003.

* cited by examiner (a)　　　　　　　　　　(b)

(a)  (b)

(a)　　　　　　　　　　(b)

Line & Polar Coordinate Representations (a)  (b)

(a)    (b)

(a)

(b)

(c)

MASKING MECHANISM FOR FILM FORMING APPARATUS

CROSS-REFERENCE TO RELATED APPLICATIONS

This application is a divisional application of U.S. Ser. No. 10/528,265, filed Mar. 17, 2005, which is a National Phase filing of PCT/JP03/11950, filed Sep. 19, 2003, which is based upon and claims the benefit of priority from the prior Japanese Patent Application No. 2002-275365, filed Sep. 20, 2002, the entire contents of which are hereby incorporated by reference.

TECHNICAL FIELD

The present invention relates to a masking mechanism or device for a film forming apparatus for the purpose of making a thin film of compositions corresponding to a ternary phase diagram.

BACKGROUND ART

In recent years a number of new physical phenomena such as those of high temperature superconducting, giant magnetic resistance, high intensity fluorescence and catalysis have been discovered. Exploring a material and composition that develops such a physical phenomenon is carried out with a combinatorial film forming apparatus in order to reduce the time expended for material investigation. Using a combinatorial film forming apparatus allows forming a library of a group of materials possible of that developing on one substrate in one vacuum process and finding a new material and a new composition from the library or deriving a theoretical prediction from a specific character of the library. It is said that the use of a combinatorial film forming apparatus can shorten the time period of a hundred years thus far spent to a month, for a material exploration.

A combinatorial film forming apparatus makes it essential to include a means for limiting supply of materials electively to a desired portion on a substrate, a film forming means for depositing films of different kind and a structural analysis means for analyzing the structure of films of desired portion on the substrate. For example, an apparatus which uses a ablation laser for film deposition, is equipped with a plurality of masking units, a target switching unit, an ablation laser light lead-in unit, a substrate heating laser unit and a reflection high-energy electron diffraction (RHEED) unit.

And, in late years demands to find new materials of binary and ternary systems have been rising. For instance, a fluorescent material for a plasma display, which is required to possess properties different from those of a conventional electron-beam excited fluorescent material, is predicted to be realized by a new material of binary or ternary system.

Materials of binary and ternary systems have so far been investigated using a combinatorial film forming arrangements as shown in FIG. 22. FIG. 22 shows diagrammatically methods of investigating materials of binary and ternary systems with the conventional combinatorial deposition arrangements. As shown in FIG. 22($a$), there are prepared a first mask 1 having a number of unmasking apertures for defining a plurality of independent specimens on a substrate, to wit to form pixels on the substrate and a second mask 2 in the form of a masking shield for selectively covering the unmasking apertures to select the pixels to be formed by vapor deposition. The relative position among the substrate, the first mask 1 and second mask 2 is adjusted to select the pixels to be formed, while a material forming the pixel by vapor deposition is selected, and this step is repeated so as to form on the substrate thin films that are of a binary or ternary phase-diagrammatic system which has predetermined ratios of components varied from pixel to pixel. Then, the pixels made are measured as to their specified properties to find out a pixel having particular properties as desired and then to determine from its ratio of components an optimum ratio of components that is required to achieve specific properties as desired.

As shown in FIG. 22($b$), there is also used a rotary disk having a plurality of masks thereon, each of which are arranged to select pixels to be formed by vapor deposition, and this rotary disk is successively rotated while a material forming pixels is selected to form pixels on a substrate, which have predetermined ratios of components differing from pixel to pixel to form binary or ternary phase-diagrammatic system. Then, the pixels made are measured as to their specified properties to find out a pixel having particular properties as desired and then to determine from its ratio of components an optimum ratio of components that is required to achieve specific properties as desired.

By the way, there is a material, such as a fluorescent material, which exhibits useful properties only in an extremely narrow rage of its ratio of components. Such a case requires the conventional methods to form an extremely large number of pixels with finely varied ratios of components. In the prior method shown in FIG. 22($a$), as the method requires the precise positioning among the substrate, the first mask 1 and second mask 2, however, this in turn requires spending considerable time, and in addition, as a result of which if an extremely large number of pixels are to be formed, then the film depositing conditions tend to change between the first and the last formed pixels. Thus, for example, the substrate temperature distribution and atmospheric composition could change uncontrollably with the lapse of time, giving rise to the problem that reproducible data, or reliable data can no longer be obtained.

And, while in the prior method shown in FIG. 22($b$) rotation makes it sufficient to position a given mask in less time-consuming, there the limitation in volume of the vacuum unit limits the number of masks that can be mounted and it is thus difficult to form an extremely large number of pixels with finely varied ratios of components. For this reason, where an extremely large number of pixels with finely varied ratios of components must be formed, the prior art must have relied on a technique as mentioned below as regards a binary system.

FIG. 23 diagrammatically shows a conventional method of making a thin film that is binary phase diagrammatic. As shown at (a) of the Figure, there are used a first mask 1 disposed perpendicular to a flow of vapor of material A or B and having an opening, a second mask 2 in the form of a masking shield movable in a scanning manner parallel to the first mask 1 and a substrate disposed across the opening of the first mask 1. In operation, as shown in (b) the mask 2 is moved in the direction of x while material A is being vaporized. Since moving the mask 2 at a constant speed in the direction of x causes material A vapor-deposited on a region of the substrate to become thicker in proportion to the time in which it is exposed to the flow of vapor of material A, there is obtained a thickness distribution of material A that increases at a given gradient in the direction of movement, namely in the direction of x. Thereafter, if as shown at (c) the material for vapor deposition is replaced with material B and the mask 2 is moved in a scanning manner from the position opposite to that shown in FIG. 23($b$) and in the direction of –x, there is then obtained a thickness distribution of material B that increases at a given gradient in the direction of movement, namely in the direction of −x. As shown at the right hand side of (c), there is thus obtained a combined thickness distribution of materials A and B made up of a film of material A whose thickness varies continuously from 0 to 100% and a film of material B whose thickness varies continuously from 100 to 0% in the direction of x. The materials A and B vapor-deposited are each extremely thin in film thickness and when coming into contact with each other are immediately mixed together into a stable state of binary material that is determined by the substrate temperature. Repeating the vapor deposition of A followed by the vapor deposition of B allows forming a thin film that is binary phase diagrammatic of a desired thickness.

This method permits obtaining a binary phase diagramming thin film in which its ratio of components continuously varies or is varied finely in the direction of x and also obtaining reliable data since the thin film can be made in an extremely short period of time. This method in a sense can be said to be a method of forming by uniaxial movement of a single mask having an opening relative to a substrate. Further, it can be said to be a method of forming by uniaxial movement of one side of the opening in the mask, namely uniaxial movement of a edge of the mask relative to the substrate. It will be apparent that this method can be expanded to form a ternary phase diagramming thin film by moving a mask edge triaxially or along three axes mutually intersecting at an angle of 120 degrees.

It is extremely difficult, however, to include such a triaxially operating masking mechanism that must necessarily become considerably large in volume in an apparatus of this type used for material exploration, e.g., in a combinatorial film forming apparatus that makes it essential to be equipped with an ablation laser light lead-in unit, a target switching unit, a substrate heating laser unit and a reflection high-energy electron diffraction unit in a vacuum chamber. This can be done, of course, by making the vacuum chamber in volume to an extent necessary to accommodate them, but so enlarging it requires augmenting the capacity of its vacuum pumping system correspondingly, thus making the apparatus highly costly.

DISCLOSURE OF THE INVENTION

In view of the problems mentioned above it is an object of the present invention to provide a masking mechanism or device for a film forming apparatus that is capable of making a thin film of a ternary phase diagrammatic system without making the apparatus costly.

In order to achieve the object mentioned above there is provided in accordance with the present invention a masking mechanism or device for a film forming apparatus, characterized in that: it comprises a single mask and a means for moving the mask relative to a substrate in a uniaxial direction; and the said mask has a first, a second and a third single action edge each of which has a normal unit vector; wherein: the normal unit vector of the said first single action edge and that of the said second single action edge make an angle of 120° relative to each other, the normal unit vector of the said second single action edge and that of the said third single action edge make an angle of 120° relative to each other, and the normal unit vector of the said third single action edge and that of the said first single action edge make an angle of 120° relative to each other.

According to this device construction of the present invention, the first single action edge is positioned immediately ahead of a substrate region where a ternary phase diagrammatic thin film is to be formed. Then, the first single action edge may be moved at a selected rate of movement while the substrate region is vapor-deposited with a first material to produce a film thickness gradient of the first material. Next, the second single action edge is positioned immediately ahead of the substrate region to be formed with the ternary phase diagrammatic thin film. Then, the second single action edge may be moved at a selected rate of movement while the substrate region is vapor-deposited with a second material to produce a film thickness gradient of the second material. Next, the third single action edge is positioned immediately ahead of the substrate region to be formed with the ternary phase diagrammatic thin film. Then, the third single action edge may be moved at a selected rate of movement while the substrate region is vapor-deposited with a third material to produce a film thickness gradient of the third material. With the first, second and third action edges oriented by making 120° with one another, these film thickness gradients that then develop makes 120° with one another, thereby forming a thin film of the ternary phase diagrammatic system from component thin films. The masking mechanism for a film forming apparatus according to the present invention entails only a single mask and a means whereby the mask can only be moved in a single axial direction and hence requires a minimum of its volume and size. With the capability of forming a thin film of a ternary phase diagrammatic system, it no longer makes it necessary to raise the equipment cost.

Here, the term "single action edge" is intended herein to mean an edge portion of the mask that acts to produce a film thickness gradient with one edge of the mask. Likewise, the "double action edge" is intended herein to mean an edge portion of the mask that acts to produce a film thickness gradient with two edges of the mask and "triple action edge" herein to mean an edge portion of the mask that acts to produce a film thickness gradient with three edges of the mask.

Specifically, the said single mask has a side making an angle of $90°+\alpha$ (where $0°\leq\alpha<90°$) relative to the said uniaxial direction, and the said mask has a first and a second opening, wherein the said first opening has a side making an angle of $30°+\alpha$ relative to the said uniaxial direction and the said second opening has a side making an angle of $-30°+\alpha$ relative to the said uniaxial direction, and the said side making an angle of $90°+\alpha$ relative to said uniaxial direction constitutes the said first single action edge, the said side making an angle of $30°+\alpha$ relative to the said uniaxial direction constitutes the said second single action edge, and the said side making an angle of $-30°+\alpha$ relative to the said uniaxial direction constitutes the said third single action edge.

According to this specific feature of the invention, as the normal unit vectors of the first, second and third single edges mutually make an angle of 120°, a thin film of a ternary phase diagrammatic system can be obtained.

Also, the said single mask may specifically comprise a single disk. Then, this disk has a first, a second and a third cutout, and the said first cutout has a side making an angle of $90°+\alpha$ (where $0°\leq\alpha<90°$) relative to a circumferential direction of the said disk, the said second cutout has a side making an angle of $30°+\alpha$ relative to the circumferential direction of the said disk and the said third cutout has a side making an angle of $-30°+\alpha$ relative to the said circumferential direction of the said disk, wherein the said side making an angle of $90°+\alpha$ relative to the circumferential direction of the said mask constitutes the said first single action edge, the said side making an angle of $30°+\alpha$ relative to the circumferential direction of said disk constitutes the said second single action edge, and the said side making an angle of $-30°+\alpha$ relative to the circumferential direction of the said disk constitutes the said third single action edge. This disk can be rotated about its center axis to give rise to a thin film of a ternary phase diagrammatic system as mentioned above.

The present invention also provides in a second form of implementation thereof a masking mechanism or device for a film forming apparatus, characterized in that it comprises a single mask and a means for moving the mask relative to a substrate in a uniaxial direction; and the said mask has a first and a second single action edge and a double action edge in the form of a triangle having its base oriented in the said uniaxial direction and its two other sides constituting action edges, wherein the normal unit vector of the said first single action edge makes an angle of 30° relative to the said uniaxial direction and the normal unit vector of the said second single action edge makes −30° relative to the said uniaxial direction.

According to this device construction of the present invention, the first single action edge is positioned immediately ahead of a region on a substrate where a ternary phase diagrammatic thin film is to be formed. Then, the first single action edge may be moved at a selected rate of movement while the substrate region is vapor-deposited with a first material to produce a film thickness gradient of the first material. Next, the second single action edge is positioned immediately ahead of the substrate region to be formed with the ternary phase diagrammatic thin film. Then, the second single action edge may be moved at a selected rate of movement while the substrate region is vapor-deposited with a second material to produce a film thickness gradient of the second material. Next, the triangular double action edge is positioned immediately ahead of the substrate region to be formed with the ternary phase diagrammatic thin film. Then, the triangular double action edge may be moved at a selected rate of movement while the substrate region is vapor-deposited with a third material to produce a film thickness gradient of the third material. In this case, the film thickness gradient produced by means of the triangular double action edge extends perpendicular to the direction in which the mask is moved and the film thickness gradients produced by means of the first and second single action edges make an angle of 120° with one another, thereby forming a thin film of the ternary phase diagrammatic system from component thin films. The masking mechanism for a film forming apparatus according to the second form of implementation of the present invention entails, here again, only a single mask and a means whereby the mask can only be moved in a single axial direction and hence requires a minimum of its volume and size. With the capability of forming a thin film of a ternary phase diagrammatic system, it does not make it necessary to raise the equipment cost.

Specifically, the said single mask may comprise a single disk. Then, this disk has a first and a second cutout, and the said first cutout is a cutout in the form of a fan having its two sides making angles of 30° and −30° relative to a circumferential direction of the said disk, respectively, and the said second cutout is a cutout having sides making angles of 60° and −60° relative to the circumferential direction of the said disk, respectively, and a side oriented parallel to the said circumferential direction.

The present invention also provides in a third form of implementation thereof a masking mechanism or device for a film forming apparatus, characterized in that: it comprises a single mask and a means for moving the mask relative to a substrate in a uniaxial direction; and the said mask has a triangular opening having a base side oriented in a said uniaxial direction, the said mask also having a side extending orthogonal to the said uniaxial direction; and the other two sides other than the base side of the said triangular opening and the said side orthogonal to the said uniaxial direction constitute a triple action edge, whereby selecting a rate of movement at which the said triangular opening is moved and a rate of movement at which the said side orthogonal to the said uniaxial direction allows a film thickness gradient to be produced in a particular direction determined by the rates of movement selected.

According to this device feature of the present invention, the triangular opening is positioned immediately ahead of a region on a substrate where a ternary phase diagrammatic thin film is to be formed. Then, the triangular opening may be moved at a selected rate of movement while the substrate region is vapor-deposited with a first material. When the triangular opening has passed over the substrate region to be formed with the ternary phase diagrammatic thin film and the said side orthogonal to the said uniaxial direction is positioned immediately ahead of the said substrate region, the rate of movement is suitably altered. Since the direction in which the thickness gradient of a thin film of the first material which is produced in this way varies depending on the rate at which the triangular opening is moved and the rate at which the said side orthogonal to the said uniaxial direction is moved, the film thickness gradient can be produced by a desired direction by suitably selecting these rate of movement. As to a second and a third material, too, the two rates of movement can suitably be selected so that the directions in which the film thickness gradients are produced for the first, second and third materials make an angle of 120° with one another, thereby forming a thin film of the ternary phase diagrammatic system desired. According to this method, it should be noted that since the direction in which a film thickness gradient is produced can be selected as desired, it is possible to form a thin film not only of a ternary phase diagrammatic system but also of a more than three components, multiple component phase diagrammatic system.

The masking mechanism for a film forming apparatus according to the third form of implementation of the present invention entails, here again, only a single mask and a means whereby the mask can only be moved in a single axial direction and hence requires a minimum of its volume and size. With the capability of forming a thin film of a ternary phase diagrammatic system, it does not make it necessary to raise the equipment cost.

Specifically, the said single mask may comprise a single disk. Then, this disk has a first cutout, and a second cutout or a first opening; the said first cutout is a fan shaped cutout, the said second cutout is a cutout having a side extending orthogonal to a circumferential direction f the said disk, and the said first opening is a triangular opening having a base side extending parallel to a circumferential direction of the said disk; and the two sides of the said fan shaped cutout and the side of the said second cutout that extends orthogonal to a circumferential direction of the said disk constitutes the said triple action edge, or the two sides of the said triangular opening other than the said base side and the side of the said second cutout that extends orthogonal to a circumferential direction of the said disk constitutes the said triple action edge.

According to this specific feature of the present invention, simply the rate of rotation of the disk can suitably be selected corresponding to the said rates of displacement so that the directions in which the film thickness gradients are produced respectively for a first, a second and a third material, thereby forming a thin film of a ternary phase diagrammatic system as desired. According to this specific method as well, it should be noted that since the direction in which a film thickness gradient is produced can be selected as desired, it is possible to form a thin film not only of a ternary phase diagrammatic system but also of a more than three components, multi-component phase diagrammatic system.

BRIEF DESCRIPTION OF THE DRAWINGS

The present invention will better be understood from the following detailed description and the drawings attached hereto showing certain illustrative forms of implementation of the present invention. In this connection, it should be noted that such forms of implementation illustrated in the accompanying drawings hereof are intended in no way to limit the present invention but to facilitate an explanation and understanding thereof. In the drawings.

BEST MODES FOR CARRYING OUT THE INVENTION

Figure 1:
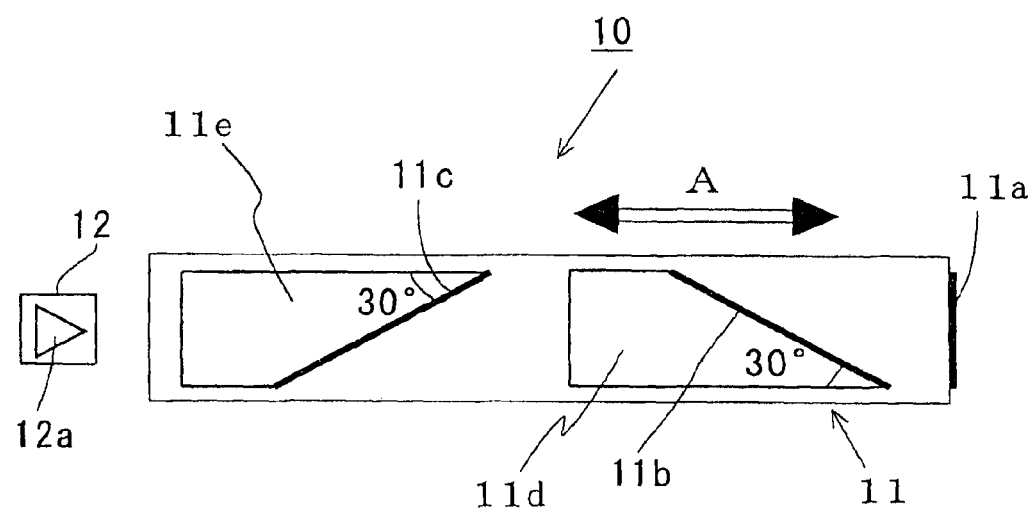
FIG. 1 is a diagram illustrating the makeup of a masking mechanism for a film forming apparatus that represents a first form of implementation of the present invention.

Hereinafter, the present invention will be described in detail with reference to certain suitable forms of implementation thereof illustrated in the drawing figures.

At the outset, it should be noted that in making a thin film of a ternary phase diagrammatic system by means of a masking mechanism or device for a film forming apparatus according to the present invention, the components that make up the ternary system, as in a manner as described above in connection with the prior art for a thin film of a binary phase-diagrammatic system, are deposited successively on a common region on a substrate to form their respective thin films successively on this region while controlling the respective directions in which their thickness gradients are to develop and this laminating step is repeated several times until the deposited thin films in combination as a thin film of the ternary phase diagrammatic system have a desired thickness. In forming the composite thin film, the component thin films are vapor-deposited each in a layer thin enough that at the time they can be superimposed on one another by vapor deposition, their materials can mutually diffuse from one layer to another to be arranged with free energy minimum. Also, a maximum thickness ratio of the component thin films is taken corresponding to the ratio of concentration, which is equal to 1, of the components in the ternary phase-diagrammatic system. While these premises are not mentioned repetitiously hereinafter, it should be understood that they always apply. Accordingly, also the term "thin film of a ternary phase diagrammatic system" when used herein is intended to mean a thin film constructed as mentioned above, namely the realization of a ternary system in its phase diagram in the form of a thin film. The particular constituent composition at a given position in such a thin film can be known from its coordinates, and measuring a value of a property specified for each of given coordinate positions in the thin film to determine a coordinate position that exhibits an optimum value of the property allows a particular constituent composition that realizes optimally the desired property identified and known.

FIG. 1 is a diagram illustrating the makeup of a masking mechanism 10 for a film forming apparatus that represents a first form of implementation of the present invention. Referring to FIG. 1, the masking mechanism 10 comprises a mask 11 supported so it can be moved back and forth linearly as indicated by the arrow A on or above a substrate 12. The mask 11 has a side $11a$ and is formed with openings 1id and $11e$ which have sides $11b$ and $11c$, respectively. the sides $11a$, $11b$ and $11c$ here constituting action edges each of which (hereinafter referred to as a "single action edge") acts to determine a thickness gradient of a thin film to be vapor-deposited.

Of these single action edges 11a, 11b and 11c, the first single action edge 11a extends perpendicular to the mask movement axis A and the second and third actions edges 11b and 11c extend inclined at angles of +θ(=30°) and −θ(=−30°) to the mask movement axis A, respectively. The single action edges 11a, 11b and 11c have their lengths each of which is sufficiently large relative to a region of equilateral triangle 12a in the substrate 12 on which a thin film of ternary phase-diagrammatic system is to be formed.

It should be noted here that a single action edge generally acts in a way as described below to develop a concentration gradient of the thin film when it is vapor-deposited on the substrate 12.

Figure 2:
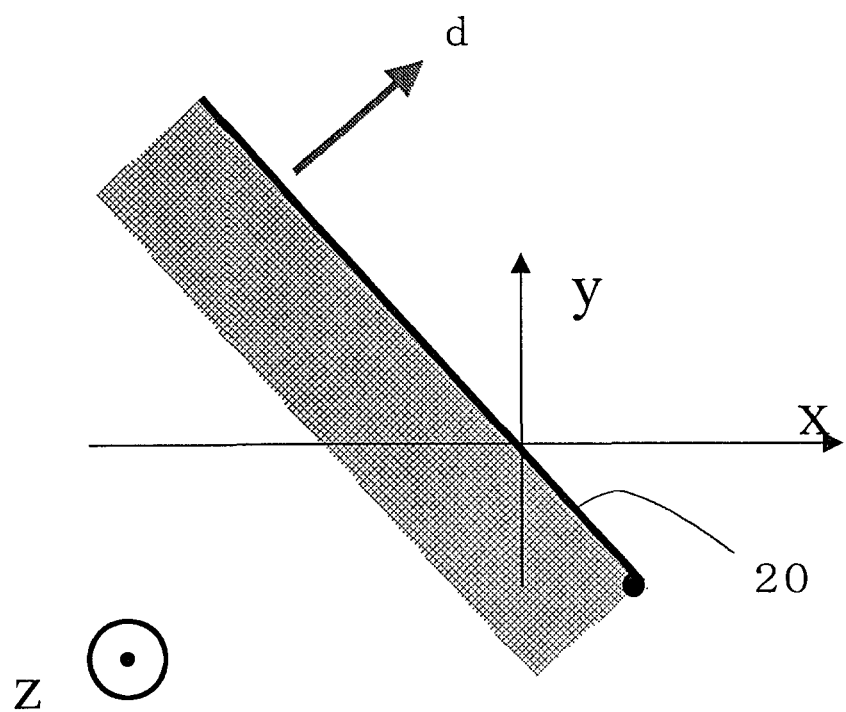
FIG. 2 is a diagram illustrating a coordinate system in which a mask has its face lying in an xy-plane and its thickness directed along a z-axis and indicating a general, single action edge.

FIG. 2 is a diagram that generally represents a single action edge in a coordinate system in which the mask 11 has its face lying in an x-y plane and has its depth extending in the direction of a z-axis. As shown in FIG. 2, the single action edge, designated by reference character 20, is made passing through the origin in the x-y plane and extending diagonally. Also, a vector d is shown as a normal unit vector of the single action edge 20 facing its mask opening side. Then, the shape of the single action edge 20 is given by a shape function as follows:

$$d_x x + d_y y = 0 \quad (1)$$

Also, the mask opening is indicated by a mask function given by an equation below.

$$d_x x + d_y y < 0 \text{ namely } {}'d \cdot \begin{pmatrix} x \\ y \end{pmatrix} < 0 \quad (2)$$

Figure 3:
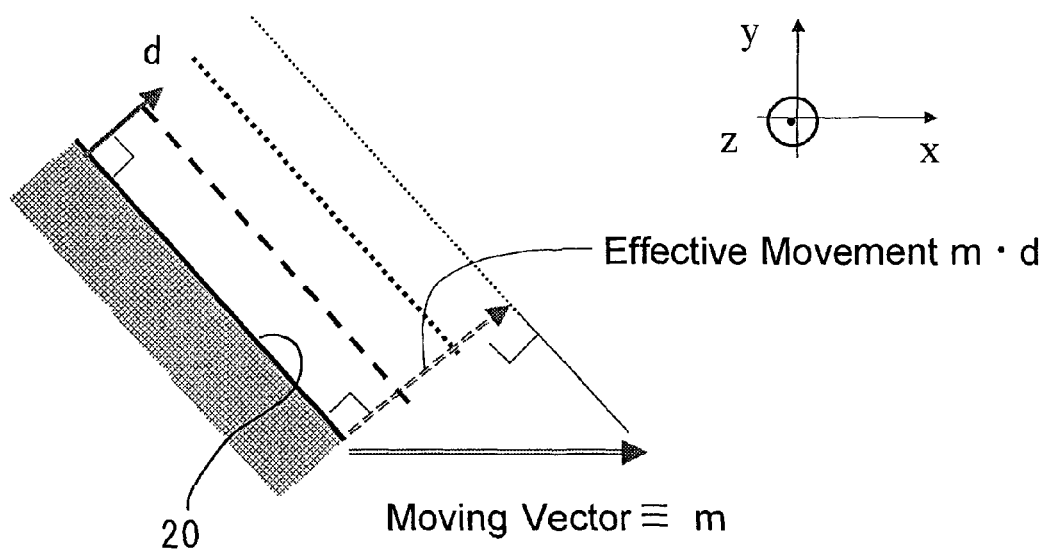
FIG. 3 is a diagram illustrating an effective movement of a single action edge that occurs when a mask is moved.

FIG. 3 is a diagram illustrating an effective movement of the single action edge 20 of FIG. 2 that occurs when the mask is moved in a direction as desired. Here, the moving vector of the single action edge 20 is assumed to be m. Moving the mask edge 20 with the moving vector m above the substrate 12 during its vapor deposition will cause the single action edge 20 to produce a maximum film thickness gradient in the direction of its normal vector d. For example, three film thickness contours indicated by three types of dotted lines in the Figure can be considered as developing. Here, the dotted lines which are the highest, the lowest and the medium in dot density are shown corresponding to the thickness contours which are the largest, the smallest and the medium in film thickness, respectively. Therefore, for any moving vector m, the inner vector product m·d comes to represent an effective amount of movement which relates to the direction in which the film thickness gradient is the maximum or is thus an effective movement (hereinafter referred to as such).

Figure 4:
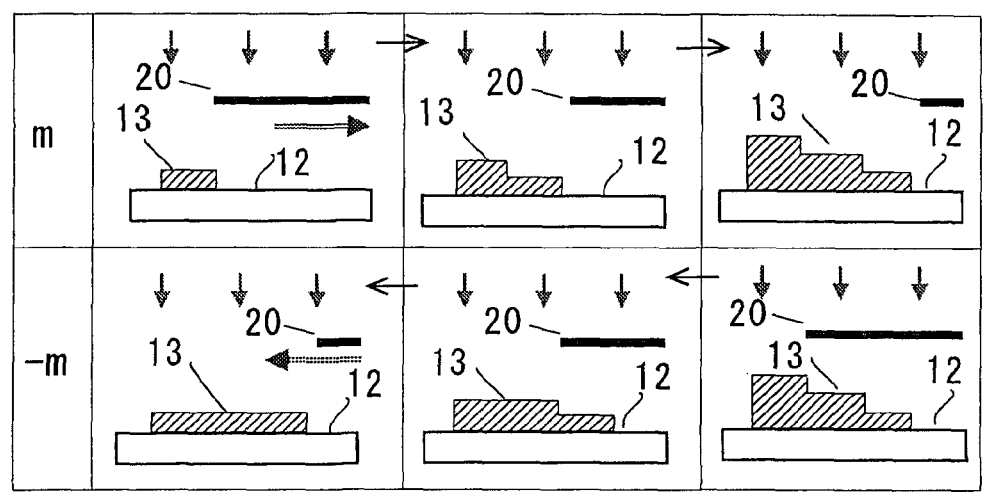
FIG. 4 illustrates in cross sectional views typically how a thin film is grown changing its thickness profile with a single action edge of a mask when the mask has its moving vector +m or −m.

FIG. 4 illustrates in cross sectional views typically how a thin film is grown changing its thickness profile with a single action edge of a mask when the mask is moved in moving vector +m or −m. It shows a process in which a thin film is being formed while the single action edge 20 of the mask is having a movement +m or −m. From the Figure in which the arrow ↓ indicates a material being vapor deposited, it is seen that the thickness gradient of a thin film that develops does not depend on the direction in which the mask is moved.

Figure 5:
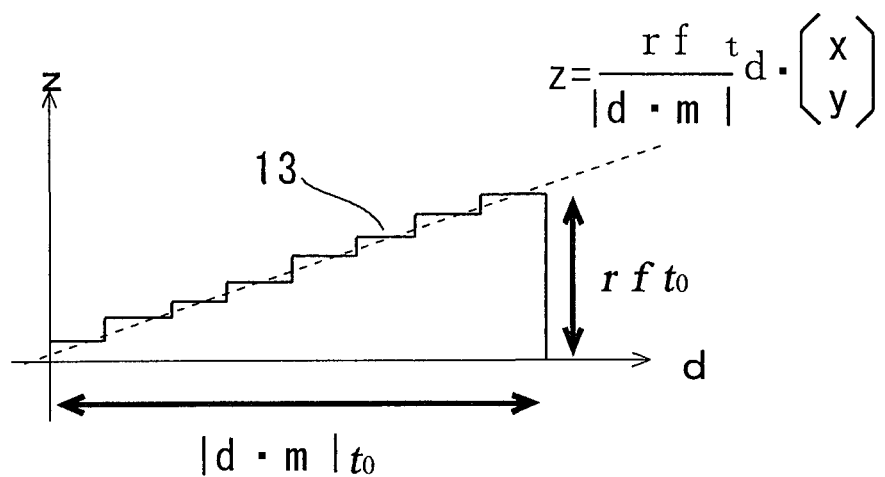
FIG. 5 is a diagram illustrating a thickness profile function of a thin film formed by means of a single action edge.

FIG. 5 is a graph illustrating a thickness profile function of a thin film formed by means of a single action edge. In the graph, the abscissa axis is taken to lie in the direction of normal vector d of the single action edge where the vapor-deposited substrate face and the mask face lie parallel to the x-y plane while the z-axis (ordinate axis) is taken to lie in the direction of the film thickness.

Here, an example is taken of laser vapor deposition and described. Assuming that the film vapor-deposited by a single laser light pulse has a thickness r (□/pulse), the number of laser light pulses irradiated per unit time or laser cycle (Hz) is f, the moving vector in is expressed by a movement per unit time (mm/sec) or rate of moving vector, and the time for vapor deposition is $t_0$, the film thickness z at any position (x, y) in the x-y plane is given by equation:

$$z = \frac{rf}{|d \cdot m|} {}'d \cdot \begin{pmatrix} x \\ y \end{pmatrix} \quad (3)$$

where ′d is row vector d.

Figure 6:
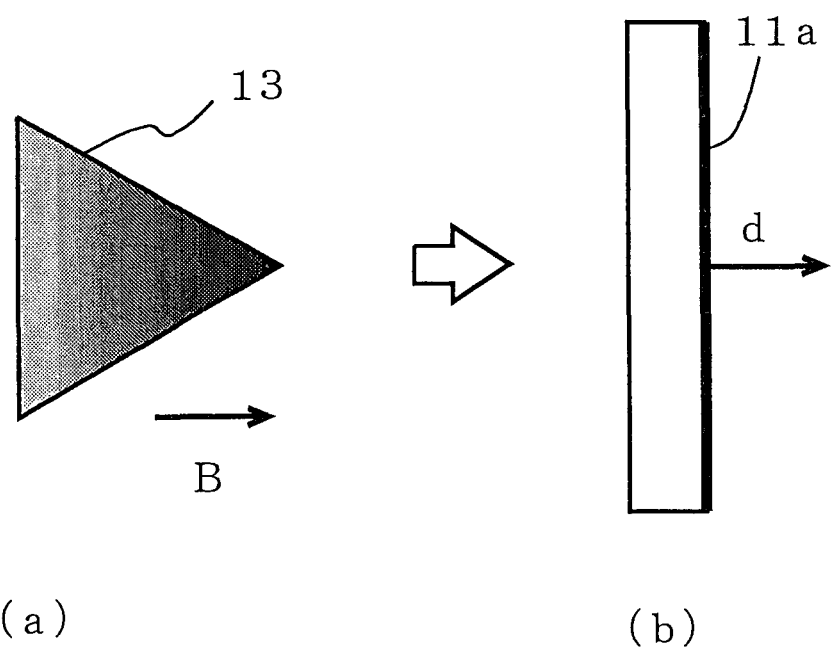
FIG. 6 diagrammatically shows that a thickness gradient develops in a thin film with a single action edge $11a$ in a masking mechanism as shown in FIG. 1.
Figure 7:
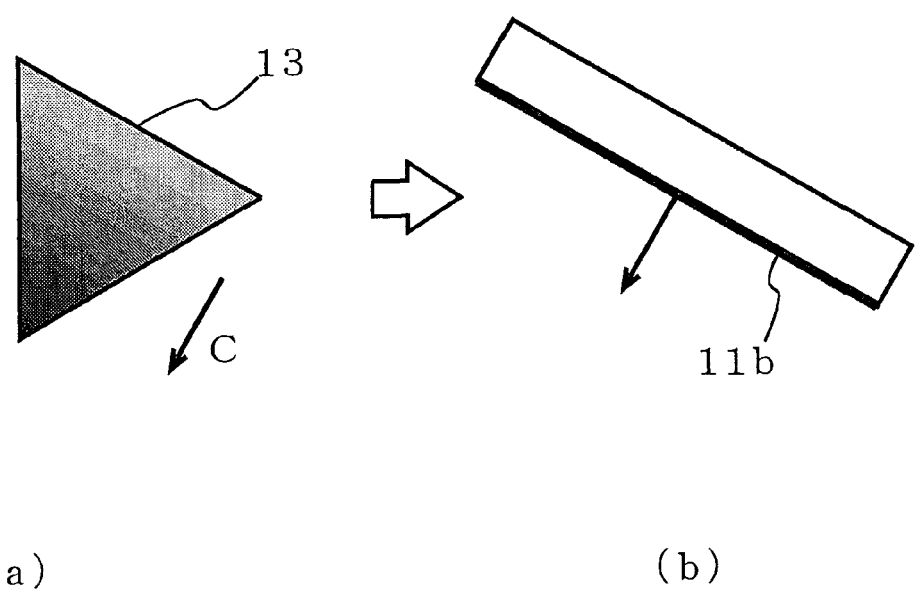
FIG. 7 diagrammatically shows that a thickness gradient develops in a thin film with a single action edge $11b$ in the masking mechanism shown in FIG. 1.
Figure 8:
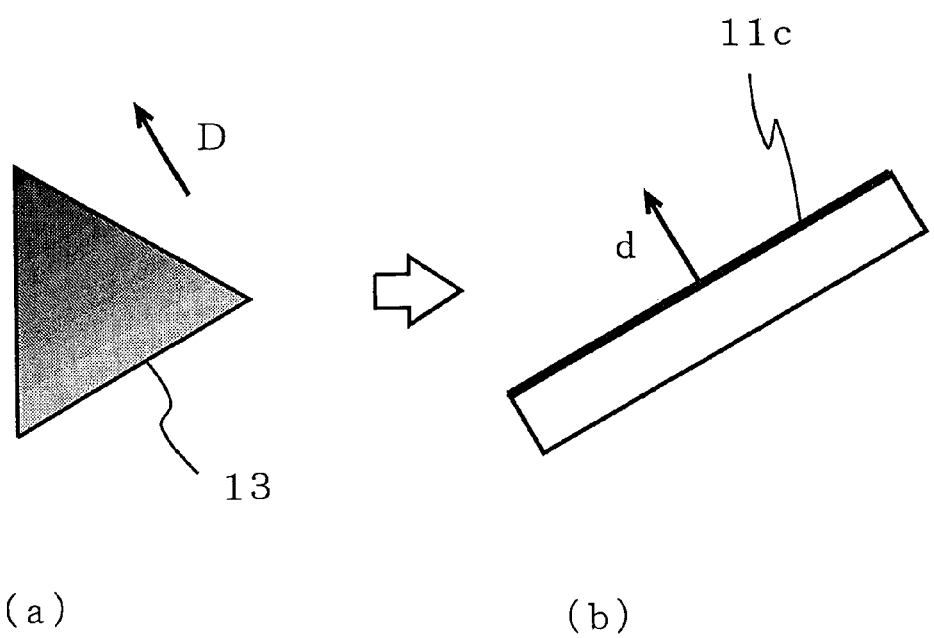
FIG. 8 diagrammatically shows that a thickness gradient develops in a thin film with a single action edge $11c$ in the masking mechanism shown in FIG. 1.

Based now on equation (3), mention is made of the thickness gradient of a thin film formed when a first, a second and a third single action edge 11a, 11b and 11c as shown in FIG. 1 are used. FIGS. 6, 7 and 8 are diagrams illustrating patterns of thickness gradient which develop in the thin film by means of the single action edges 11a, 11b and 11c in the masking mechanism 10 in FIG. 1, respectively. In the discussion that follows, an example is taken of the case that a ternary phase diagram is formed in the shape of an equilateral triangle having one side perpendicular to the direction in which the mask is moved.

The single action edges 11a, 11b and 11c have their respective normal vectors which are expressed by column vectors in equations below, respectively.

$$d = \begin{pmatrix} 1 \\ 0 \end{pmatrix}, d = \begin{pmatrix} -\frac{1}{2} \\ \frac{\sqrt{3}}{2} \end{pmatrix}, d = \begin{pmatrix} -\frac{1}{2} \\ -\frac{\sqrt{3}}{2} \end{pmatrix} \quad (4)$$

Substituting the row vectors of these column vectors for equation (3) gives rise to thickness profile functions z corresponding to the single action edges 11a, 11b and 11c, respectively, which are in turn expressed by equations below, respectively.

$$z \propto x, \; z \propto -\frac{1}{2}x + \frac{\sqrt{3}}{2}y, \; z \propto -\frac{1}{2}x - \frac{\sqrt{3}}{2}y \quad (5)$$

FIG. 6 diagrammatically shows thickness profile function z in the case of the single action edge 11a wherein (a) indicates the film thickness expressed by equation (5) with the darkness in black color (the darker in black color the thicker is the film and the less dark in black color the thinner is the film), there being also indicated by vector B the direction in which the film thickness becomes progressively thicker. Diagram (b) indicates the orientation of the single action edge 11a relative to the equilateral triangular substrate region 13, there being also indicated by the white arrow the direction in which the single action edge 11b is moved.

FIG. 7 likewise diagrammatically shows thickness profile function z in the case of the single action edge 11b wherein (a) indicates the film thickness expressed by equation (5) with the darkness in black color, there being also indicated by vector C the direction in which the film thickness becomes progressively thicker. Diagram (b) indicates the orientation of the single action edge 11b relative to the equilateral triangular substrate region 13, there being also indicated by the white arrow the direction in which the single action edge 11b is moved.

FIG. 8 diagrammatically shows thickness profile function z in the case of the single action edge 11c wherein (a) indicates the film thickness expressed by equation (5) with the darkness in black color, there being also indicated by vector D the direction in which the film thickness becomes progressively thicker. Diagram (b) indicates the orientation of the single action edge 11c relative to the equilateral triangular substrate region 13, there being also indicated by the white arrow the direction in which the single action edge 11c is moved.

As is apparent from FIGS. 6 to 8, the masking mechanism 10 for a film forming apparatus as the first form of implementation of the present invention can produce thickness gradients in, or distribute a thickness gradient into, three different directions which are mutually angularly spaced apart by an angle of 120°. Thus, a thin film of a ternary phase-diagrammatic system can be made by using a different material for vapor deposition on a common triangular substrate region 13 for each of film forming operations by means of single action edges 11a, 11b and 11c, respectively, acting thereon. Although a mask is shown in and described above in connection with FIGS. 4 and 5 as being moved stepwise to form a thin film stepwise for the sake of facilitating the understanding of its operations, it should be noted that the mask can in actual practice be moved continuously to form a thin film while changing its thickness continuously.

Also, while mention is made above of a triangular substrate region in which thickness gradients by means of single action edges 11a, 11b and 11c are superimposed to form a ternary phase diagrammatic thin film, it will be appreciated that in the outside of such a triangular region it is possible to simultaneously form a film of a binary phase diagrammatic system and further to simultaneously form a simple film composed of a single component.

In the search of a material using thin films of a ternary phase diagrammatic system, properties of thin films of its binary phase diagrammatic system and thin films of its single component give auxiliary but highly useful information. Thus, the feature of the masking mechanism 10 according to the present invention that it permits a thin film of a binary phase diagrammatic system and a thin film of a single component or a mono-film to be formed on an identical substrate on which a thin film of their ternary phase diagrammatic system is simultaneously formed is extremely useful in the search of a material by means of a thin film of a ternary phase diagrammatic system.

Figure 9:
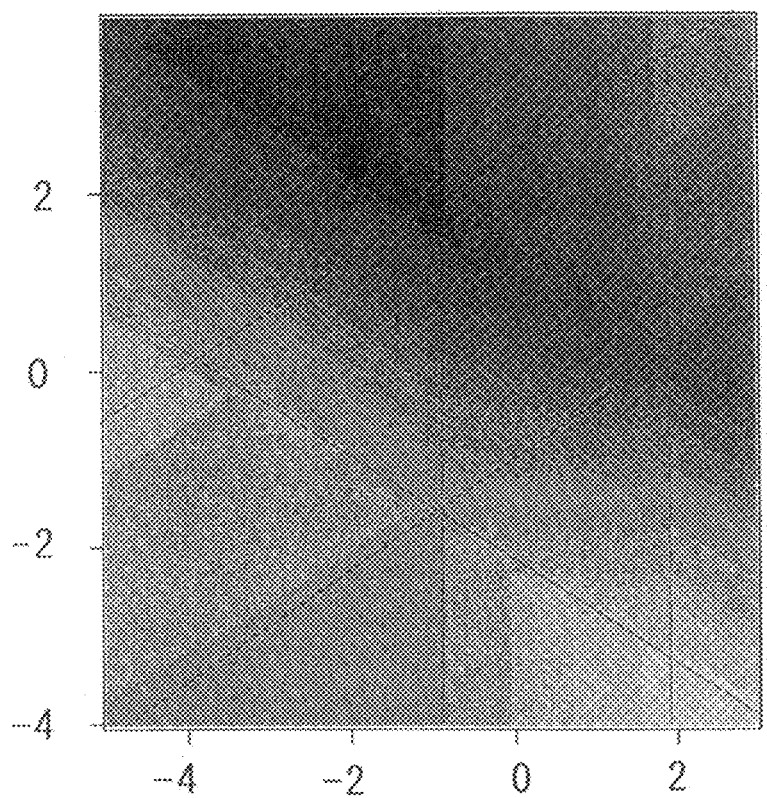
FIG. 9 is a simulated picture depicting in the thickness of black color the thickness distribution of a thin film of ternary system formed on a substrate by means of the masking mechanism shown in FIG. 1.
Figure 10:
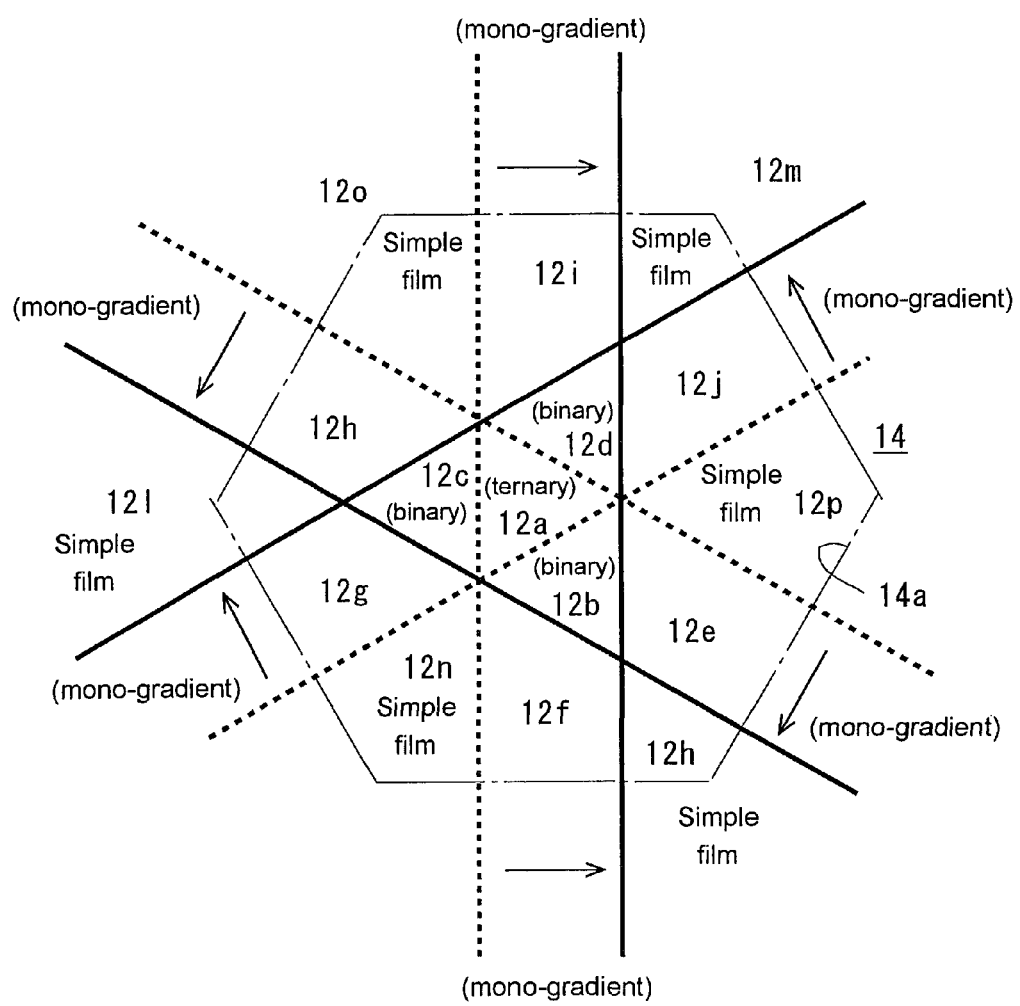
FIG. 10 is a diagram illustrating in the makeup of components various regions in the thin film of ternary system shown in FIG. 9.

Mention is made below of binary phase diagrammatic film formed regions and mono-film formed regions. FIG. 9 is a simulated picture depicting in the thickness of black color the thickness distribution of a thin film of ternary system formed on a substrate by means of the masking mechanism shown in FIG. 1. FIG. 10 is a diagram illustrating in the makeup of components various regions in the thin film of ternary system shown in FIG. 9.

In FIG. 10, respective sets of dotted and solid lines shown parallel to each other represents respective sets of film thickness contours of the three component materials of a ternary system, indicating that there is a concentration gradient from the dotted line towards the solid line in each set. In an equilateral triangular region 12a at the center of a substrate 12 where the concentration gradients of the three component materials overlap, there is formed a thin film of the ternary phase diagrammatic system. Further, in equilateral triangular regions 12b, 12c and 12d which adjoin the three sides of the equilateral triangle 12a, respectively, and where the concentration gradients of two of the three component materials overlap, there are formed thin films of binary phase diagrammatic system.

Also, in regions 12e, 12f, 12g, 12h, 12i and 12j which adjoin these regions 12b, 12c and 12d, one of two materials is deposited with a constant thickness and while the other is deposited with a concentration gradient, thus giving rise to thin films of, so-called mono-gradient.

Further, in regions 12h, 12l and 12m of regions 12h, 12l, 12m, 12n, 12o and 12p which lie outside of the apexes of the regions 12b, 12c and 12d, each of two materials is deposited with a constant thickness while in regions 12n, 12o and 12p, one material is deposited with a constant thickness, thus forming so-called simple films.

It will now be appreciated that analyzing thin films of single components in the regions 12n, 12o and 12p allows checking the quality of the thin film of each of the components while evaluating the mono-gradient regions 12e, 12f, 12g, 12h, 12i and 12j allows detecting the rate of evaporation of each of the materials. To this end, therefore, in FIG. 10 the substrate 12 during vapor deposition can have a mask 14 mounted thereon which is separate of the mask 11 and which is formed with an unmasking aperture 14a (indicated by the alternate long and short dash line in FIG. 10) centering around the region 12a of the substrate 12 and larger in area than the region 12a. Then, the thin films in the regions 12e-12p expose their vertical sections to where the masking edges of the mask 14 define the unmasking aperture 14a, thereby facilitating measurement of the thickness of each of thin films grown in these regions 12e-12p. For example, from
measurements of those regions of the thin films formed by first vapor-deposition operation, the relationship between the rate of vapor deposition and the film thickness, and the relationship between the film thickness and concentration for each component are known. These known data will then allow a second ternary phase diagrammatic film vapor-depositing operation based thereon to form a thin film precisely of a ternary phase diagrammatic system as desired. According to this method which makes only two ternary phase diagrammatic film vapor-depositing operations sufficient, the time period that need be expended for the search for a ternary material can be made short largely.

In the masking mechanism 10 in the form of implementation of the invention described, the single action edges 11a, 11b and 11c may generally be inclined to the direction in which the mask is moved, at an angle of 90°+α°, an angle of 30°+α° and an angle of −30°+α, respectively, where −90<α<90. In this case in general, too, the normal unit vectors of the single action edges 11a, 11b and 11c are mutually spaced apart by an angle 120°, permitting the formation of a ternary phase diagrammatic thin film.

An explanation is next given in respect of a disk type mask moving rotationally.

Figure 11:
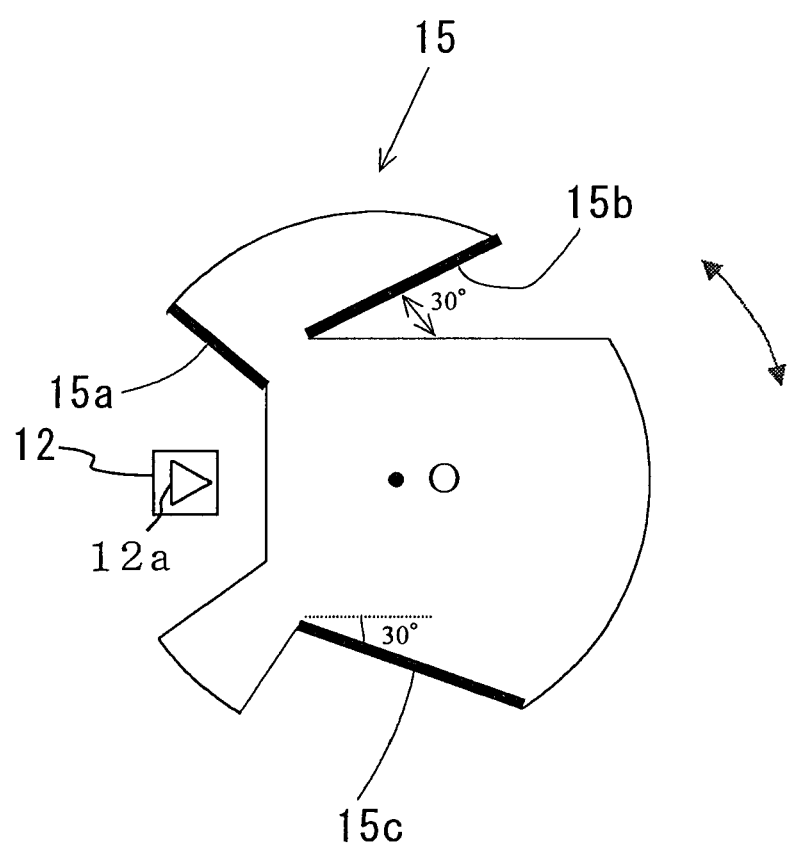
FIG. 11 is a diagram illustrating a rotationally moving mask in a modification of the masking mechanism shown in FIG. 1.

While in the previous form of implementation of the invention the masking mechanism 10 includes the mask 11 moving linearly, a masking mechanism may alternatively be provided that comprises a disk type mask moving rotationally. FIG. 11 shows a rotationally moving mask in a modification of the masking mechanism shown in FIG. 1. This mask, designated by reference character 15, is used so it is rotated about its center O. The mask 15 is formed with single action edges 15a, 15b and 15c corresponding to the single action edges 11a, 11b and 11c described previously. The first single action edge 15a extends radially of the disk, the second single action edge 15b extends at an angle of inclination +θ(=30°) to a circumferential direction and third single action edge 15c extends at an angle of inclination −θ(=30°) to a circumferential direction.

The single action edges 15a, 15b and 15c have their lengths each of which is chosen to be enough large compared to the equilateral triangular region 12a of a substrate 12 on which a ternary phase diagrammatic thin film is to be formed.

Figure 12:
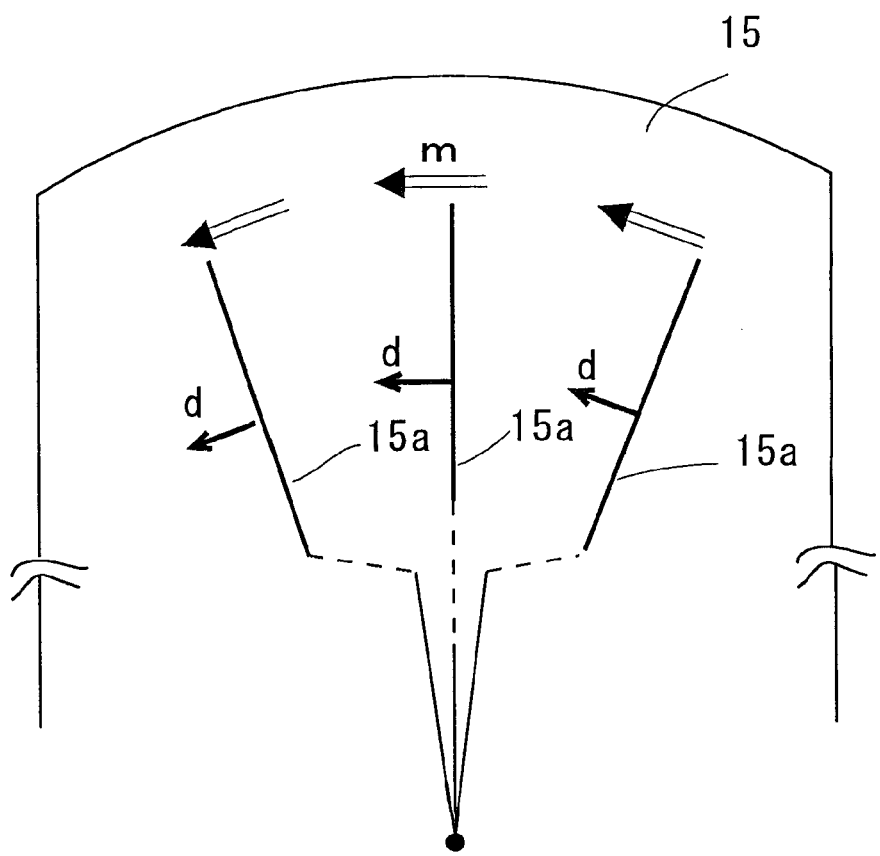
FIG. 12 is a partially enlarged diagram illustrating a single action edge moving as a mask is rotated.

FIG. 12 shows, as partially enlarged, a single action edge moving as the mask 15 is rotated. As can be seen from the Figure the single action edge, e.g., 15a, changes the direction of its normal unit vector with the rotation of the mask 15 to an extent that the thickness gradient of a thin film being formed can no longer be expressed linearly with respect to line coordinates x and y. It is thus desirable that the disk constituting the mask 15 have a diameter large enough that a movement of the single action edges 15a, 15b and 15c with its rotation can be approximated as a linear movement.

Figure 13:
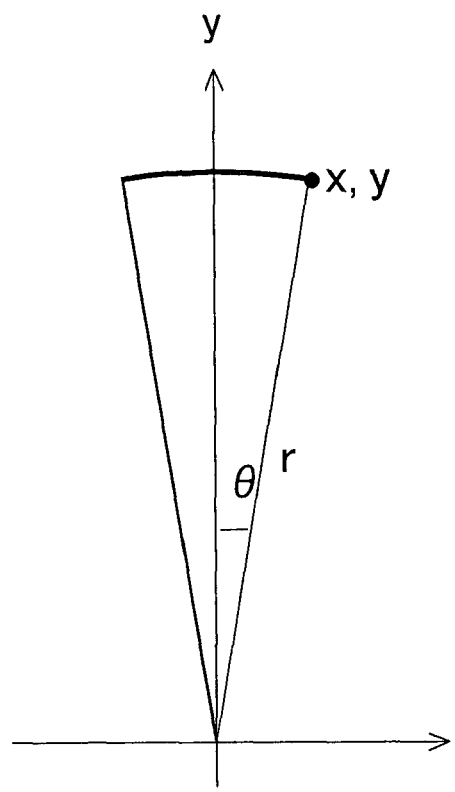
FIG. 13 is a diagram illustrating a position on a substrate in both line coordinates (x, y) and polar coordinates (r, θ) with the center of rotation as their origin.

Further, if the diameter of the disk constituting the mask 15 cannot be made so enough large, then a corrective method as shown below may be used. FIG. 13 is a diagram illustrating a position on a substrate 12 in both line coordinates (x, y) and polar coordinates (r, θ) with the center of rotation O as their origin. Since a film at a position which is identical in θ to but different in r from another still has an identical thickness and the thickness can be found from θ, the film thickness at that position can be accurately determined by converting the position in line coordinate (x, y) into polar coordinates, utilizing an equation given below.

$$\begin{cases} x = r\cos\theta \\ y = r\sin\theta \end{cases} \text{ or } \begin{cases} y = \sqrt{x^2 + y^2} \\ \theta = \cos^{-1}\frac{y}{\sqrt{x^2 + y^2}} \end{cases} \quad (6)$$

The center of rotation O can be assumed to be the center of the mask 15 for the single action edge 15a. And, for the single action edges 15b and 15c their effective center of rotation with the rotation of the mask 15 can be assumed to be the origin of coordinates O.

Figure 14:
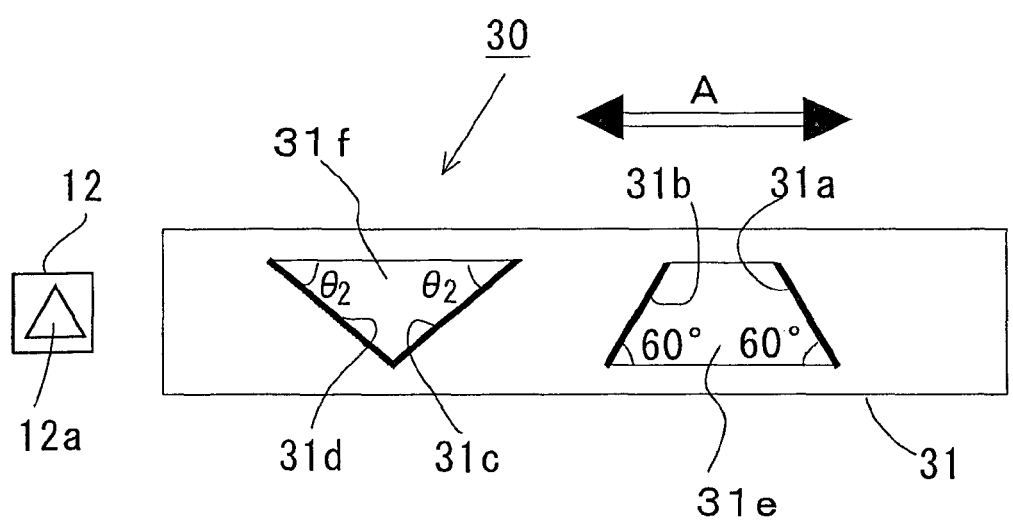
FIG. 14 is a diagram illustrating the makeup of a masking mechanism for a film forming apparatus that represents a second form of implementation of the present invention.

Referring next to FIG. 14, an explanation is given in respect of another masking mechanism for a film forming apparatus as a second form of implementation of the present invention. In the Figure, this masking mechanism, designated by reference character 30, comprises a mask 31 supported so it can be moved forth and back linearly along an axis indicated by arrow A. The mask 31 is formed with unmasking openings 31e and 31f. The opening 31e has two single action edges 31a and 31b which are designed to produce two film thickness gradients independently of each other while the opening 31f has two action edges 31c and 31d (which are collectively referred to as a double action edge) that are designed to act jointly at the same time in developing a film thickness gradient.

Here, of the two single action edges 31a and 31b and the double action edge 31c, 31d, it should be noted that the first single action edge 31a extends at an angle of inclination +θ1 (=60°) to the mask movement axis A and the second single action edge 31b extends at an angle of inclination −θ1 (=60°) to the mask movement axis A. And, the edges 31c and 31d of the double action edge extend at angles of inclination +θ2 and −θ2 to the mask movement axis A, respectively, and intersect with each other at a vertical position (as shown, lower). These single and double action edges 31a, 31b, 31c and 31d have their lengths each of which is chosen to be enough long compared with the equilateral triangular region 12a on of a substrate 12 on which a ternary phase diagrammatic thin film is to be formed.

Figure 15:
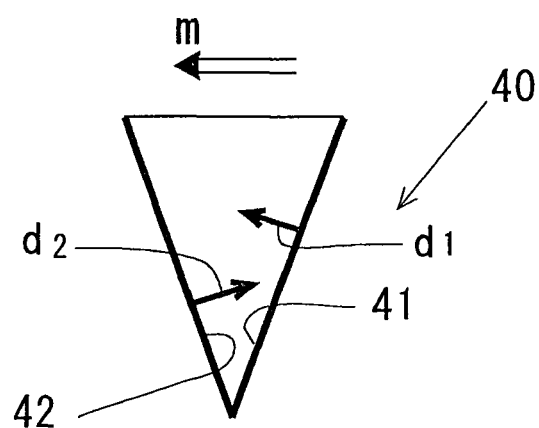
FIG. 15 is a plan view illustrating the makeup of a double action edge.

Note, here, that the double action edge acts to develop a thickness gradient of a thin film being vapor-deposited on the substrate 12, as stated below. FIG. 15 is a plan view illustrating the makeup of a double action edge. As shown, the double action edge, designated by reference character 40, comprises edges 41 and 42 having normal unit vectors $d_1$ and $d_2$, respectively, in an xy plane and it is assumed that moving vector 111 is oriented in the direction of −x. Then, since scalar product $d_1 \cdot m > 0$ and $d_2 \cdot m < 0$ there, the thickness profile produced by the double action edge 40 to a thin film being formed is described by a function which is given by the sum of a thickness profile function according to equation (3) for the edge 41 and a thickness profile function according to equation (3) for the edge 42, namely by equations:

$$z_1 = \frac{rf}{d_1 \cdot m} {'} d_1 \cdot \begin{pmatrix} x \\ y \end{pmatrix} \quad (7)$$

$$z_2 = \frac{rf}{d_2 \cdot m} {'} d_2 \cdot \begin{pmatrix} x \\ y \end{pmatrix}$$

which can in turn be transformed to give an equation below.

$$z_1 + z_2 = -\frac{rf\sin\theta}{(d_1 \cdot m)(d_2 \cdot m)} {'} m_\perp \cdot \begin{pmatrix} x \\ y \end{pmatrix} \quad (8)$$

where θ is an angle that the normal unit vectors $d_1$ and $d_2$ make and m is vector orthogonal to vector m. From this equation it is seen that the double action edge 40 produces a maximum film thickness gradient in a direction perpendicular to the moving vector m.

Figure 16:
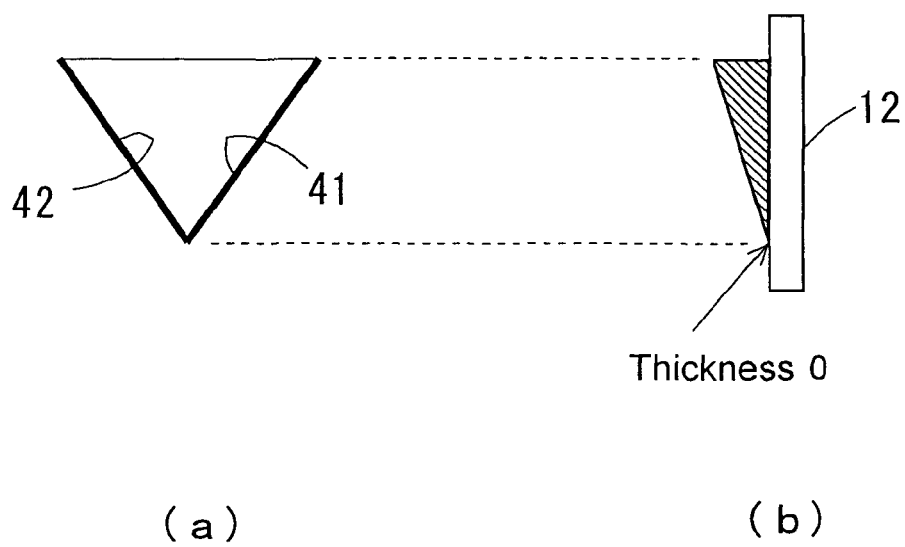
FIG. 16 is a diagram illustrating a thickness gradient of a thin film that develops with a double action edge as shown in FIG. 15.

FIG. 16 is a diagram illustrating a thickness gradient of a thin film that develops with a double action edge 40 as shown in FIG. 15 wherein (a) is a plan view of a mask having the double action edge mask and (b) is a cross sectional view of the mask taken in a direction perpendicular to that of the mask moving vector m, from which it is seen that the film thickness becomes 0 at a point of intersection of the edges 41 and 42 in the double action edge.

Figure 17:
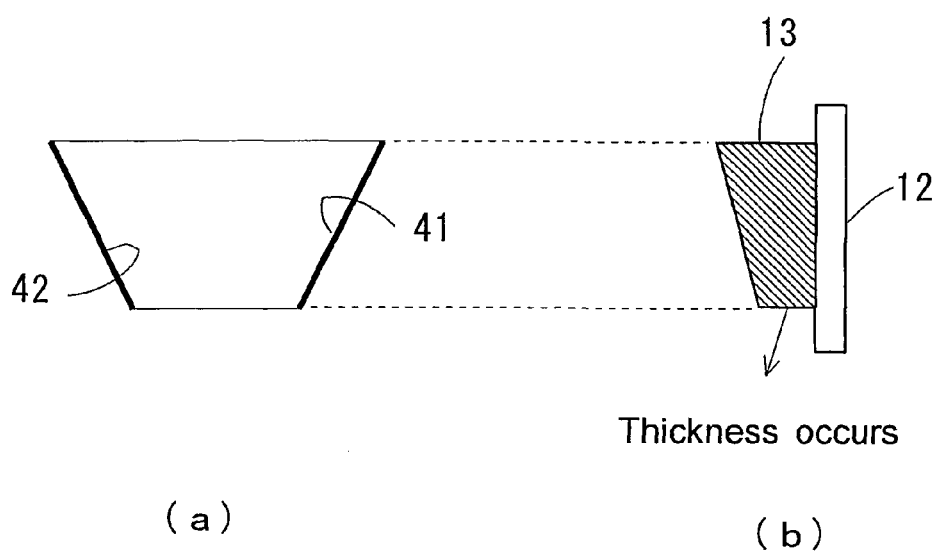
FIG. 17 is a diagram illustrating a thickness gradient of a thin film that develops with a double action edge whose two edges do not intersect with each other.

In contrast to this, there is also the case that the edges in the double action edge do not intersect. FIG. 17 is a diagram illustrating a thickness gradient of a thin film that develops with a double action edge whose two edges do not intersect with each other wherein (a) is a plan view of a mask having such a double action edge and (b) is a cross sectional view of the mask taken in a direction perpendicular to that of the mask moving vector m, from which it is seen that in the case of a double action edge whose edges do not intersect, there is no point produced where the film thickness becomes 0.

Thus, in the mask mechanism 30 for a film forming apparatus shown in FIG. 14 as the second form of the present invention, the double action edge 31c, 31d of the mask 31 can be used to produce a film thickness gradient of one component in a first direction which is perpendicular to the direction in which the mask 31 is moved and the single action edges 31a and 31b can be used to produce film thickness gradients of the other two components in a second and a third direction which are inclined at +120° and −120° to the first direction, respectively, to form a ternary phase diagrammatic thin film.

Here as in the first form of implementation described in connection with FIG. 10, there can be formed such a ternary phase diagrammatic thin film in an equilateral triangular region around the center, and also binary phase diagrammatic thin films in regions adjacent to the sides of the triangle and further single thin films in their outsides.

Therefore, as in the first form of implementation described earlier, for example, a first vapor-deposition operation may be carried out to give rise to measurements of thin films then formed in those regions and then to find from these measurements the relationship between the rate of vapor deposition and the film thickness and the relationship between the film thickness and concentration for each component. These measured data will then allow a second ternary phase diagrammatic film vapor-depositing operation based thereon to form a thin film precisely of a ternary phase diagrammatic system as desired. According to this method which makes only two ternary phase diagrammatic film vapor-depositing operations sufficient, the time period that need be expended for the search for a ternary material can be made short largely.

Figure 18:
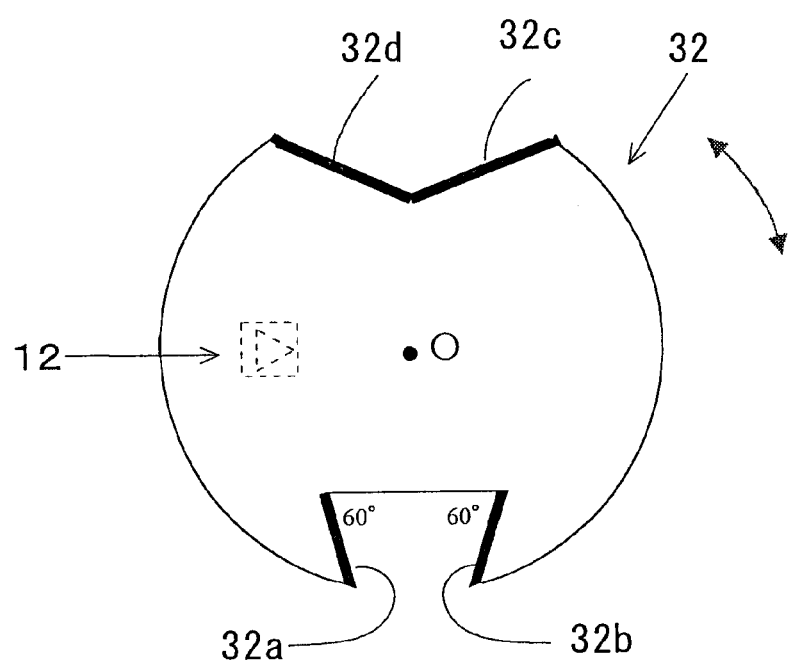
FIG. 18 is a plan view illustrating the makeup of a rotationally moving mask as a modification of mask 31.

Referring next to FIG. 18, an explanation is given in respect of a rotationally moving mask as a modification of the mask 31 shown in FIG. 14. While in that form of implementation of the invention the masking mechanism 30 is provided with the mask 31 moving linearly, as shown it may alternatively be with a disk type mask 32 moving rotationally. In this case, the mask 32 comprises single action edges 32a and 32b and double action edges 32c and 32d corresponding to the aforesaid single action edges 31a and 31b and double action edges 31c and 31d. Of them, the first single action edge 32a extends inclined at an angle of +θ1 (=60°) to a circumferential direction as a direction in which the mask is rotationally moved and the second single action edge 32b extends inclined at an angle of −θ1 (=−60°) likewise to a circumferential direction. The edges 32c and 32d in the double action edge extend inclined at angles of +θ2 and −θ2 to a circumferential direction, respectively.

These single and double action edges 32a, 32b, 32c and 32d have their lengths each of which is chosen to be enough long compared with the equilateral triangular region 12a of a substrate 12 on which a ternary phase diagrammatic thin film is to be formed.

Further, it is desirable that the disk constituting the mask 32 have its diameter chosen large enough that changes in angular orientation of the single action edges 32a and 32b and the double action edges 32c and 32d with the rotation of the disk are minimum. In this case, too, the corrective operation of linear to polar coordinate conversion previously described in connection with FIG. 13 for the first form of implementation can be used to properly compensate for rotary movements of the mask 32.

Figure 19:
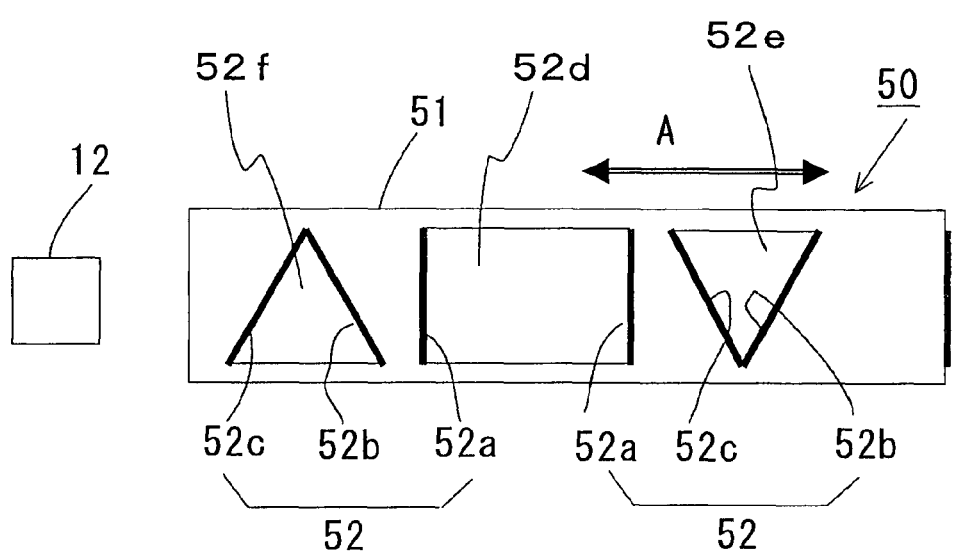
FIG. 19 is a diagram illustrating the makeup of a masking mechanism for a film forming apparatus that represents a third form of implementation of the present invention.

Referring next to FIG. 19, an explanation is given in respect of another masking mechanism for an film forming apparatus as a third form of implementation of the present invention. In the Figure, this masking mechanism, designated by reference character 50, comprises a mask 51 supported so it can be moved forth and back linearly along an axis indicated by arrow A. The mask 51 is formed with unmasking openings 52d, 52e and 52f, which are designed to configure a triple action edge system in which three masks act concurrently to produce a single film thickness gradient by means of a triple action edge 52 comprising edges 52a, 52b and 52c provided therein. To make up the triple action edge 52, there are two edges 52a each of which extends perpendicular to the mask displacement axis A and two sets of edges 52b and 52c wherein in each set, the two edges 52b and 52c extend oppositely inclined each other at a given angle to the mask displacement axis, and intersecting to each other at a point. Here again, the edges 52a, 52b and 52c have their lengths each of which is chosen to be enough large compared with the equilateral triangular region 12a of a substrate 12 on which a ternary phase diagrammatic thin film is to be formed.

According to the masking mechanism 50 constructed as mentioned above, moving the mask 51 along the mask movement axis A allows the edges 52a to produce a maximum film thickness gradient in the direction of the mask movement axis A and the edges 52b and 52c to produce a maximum film thickness gradient in a direction perpendicular to the mask movement axis A. Then, if it is assumed that $z_1$, $z_2$ and $z_3$ are functions describing film thickness profiles produced by the edges 52a, 52b and 52c, respectively; m is movement vector of the edges 52b and 52c; m' is the moving vector of the edges 52a; and further $d_1$, $d_2$ and $d_3$ are the normal unit vectors of the edges 52a, 52b and 52c, respectively, the total film thickness profile function can then be given by an expression below.

$$z_1 + z_2 + z_3 = \frac{rf \sin\theta}{(d_1 \cdot m)(d_2 \cdot m)} 'm_\perp \cdot \binom{x}{y} + \frac{rf}{|d_3 \cdot m'|} 'd_3 \cdot \binom{x}{y} \quad (9)$$

$$= rf \left( \frac{\sin\theta}{(d_1 \cdot m)(d_2 \cdot m)} 'm_\perp + \frac{1}{|d_3 \cdot m'|} 'd_3 \right) \cdot \binom{x}{y}$$

In the latter equation in expression (9), it is seen that what lies in the first bracket is a sum of a vector oriented perpendicular to, and having a magnitude dependent on the magnitude of the moving vector m and a vector oriented in the direction of normal unit vector $d_3$ and having a magnitude dependent on the magnitude of the moving vector m'. Assuming the unit vector perpendicular to m to be $k_1$, the unit vector in the direction of normal unit vector $d_3$ to be $k_2$ and their magnitudes to be a and b, respectively, their compound vector v can be given by an equation below.

$$v = ak_1 + bk_2 \quad (10)$$

Thus, adjusting vector magnitudes a and b by suitably selecting mask's rate of displacement m, m' allows aligning the direction of vector v in a direction desired. Since a maximum film thickness gradient develops in the direction of vector v, it is made possible to produce such a film thickness gradient in a desired direction. To with, suitably adjusting the rate of movement of the edge 52a, m, and the rate of displacement of the edges 52b and 52c, m', it is possible to obtain a desired film thickness gradient in a desired direction. Therefore, selecting in and m' for each of components to produce film thickness gradients in directions mutually angularly spaced by an angle of 120° permits forming a ternary phase diagrammatic thin film using a single mask.

Figure 20:
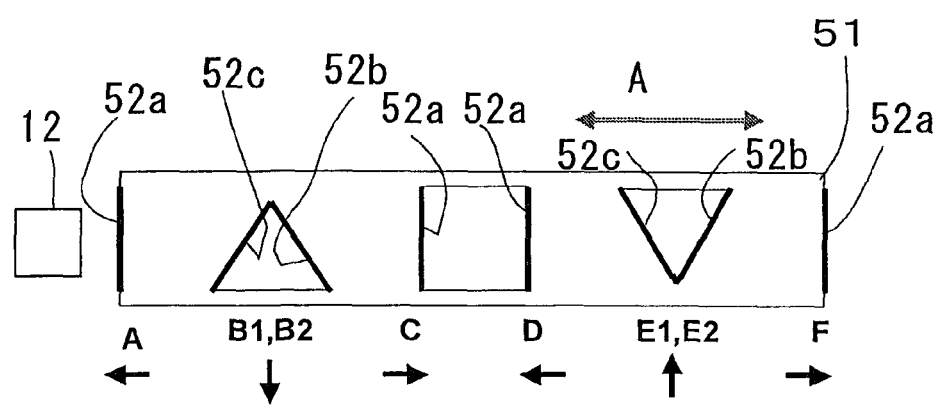
FIG. 20 is a plan view illustrating another example of making a thin film of ternary system by means of the masking mechanism shown in FIG. 19.
Figure 20:
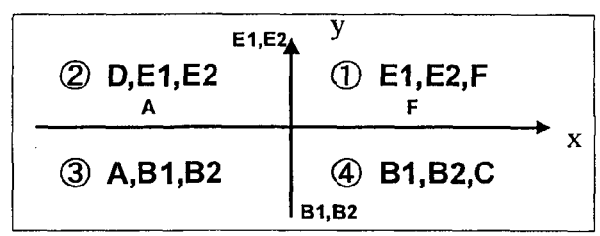

FIG. 20 is a plan view illustrating another example of making a ternary phase diagrammatic thin film by means of a masking mechanism as shown in FIG. 19. As shown at (a), a mask 51 formed with a triple action edge 52 having suitably contoured is used. These edges are indicated by A, B1, B2, C, D, E1, E2 and F below which are indicated by arrows directions in which film thickness gradients are produced thereby, respectively, when the mask is moved along the mask movement axis A. It follows, therefore, that as shown at (b) selecting these edges sequentially allows producing desired film thickness gradients in all the directions covering from the first to fourth quadrants to form a ternary phase diagrammatic thin film.

Figure 21:
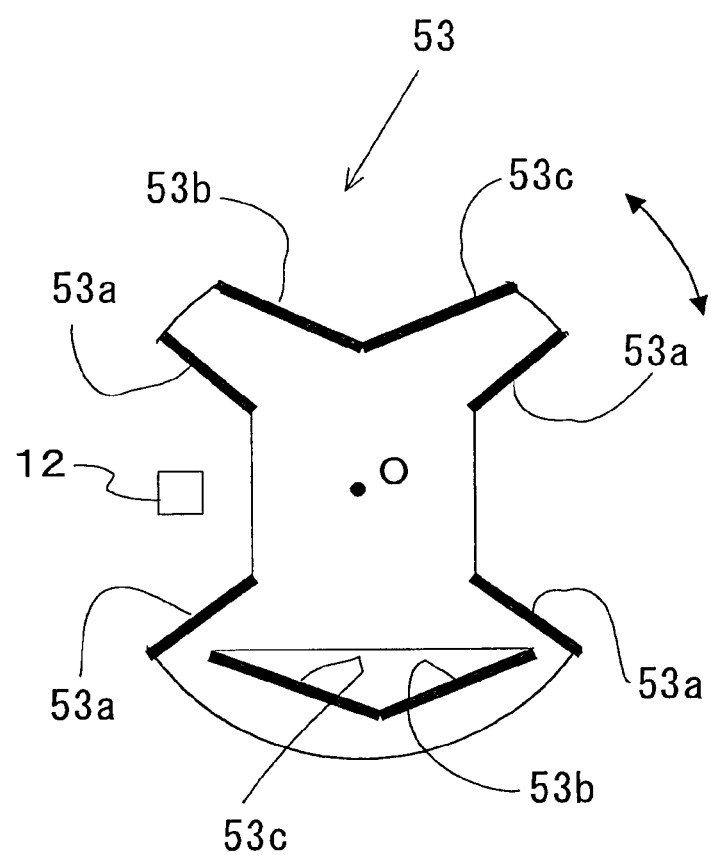
FIG. 21 is a plan view illustrating a modification of the masking mechanism of FIG. 19 in which the mask is constituted by a rotationally moving mask.
Figure 22:
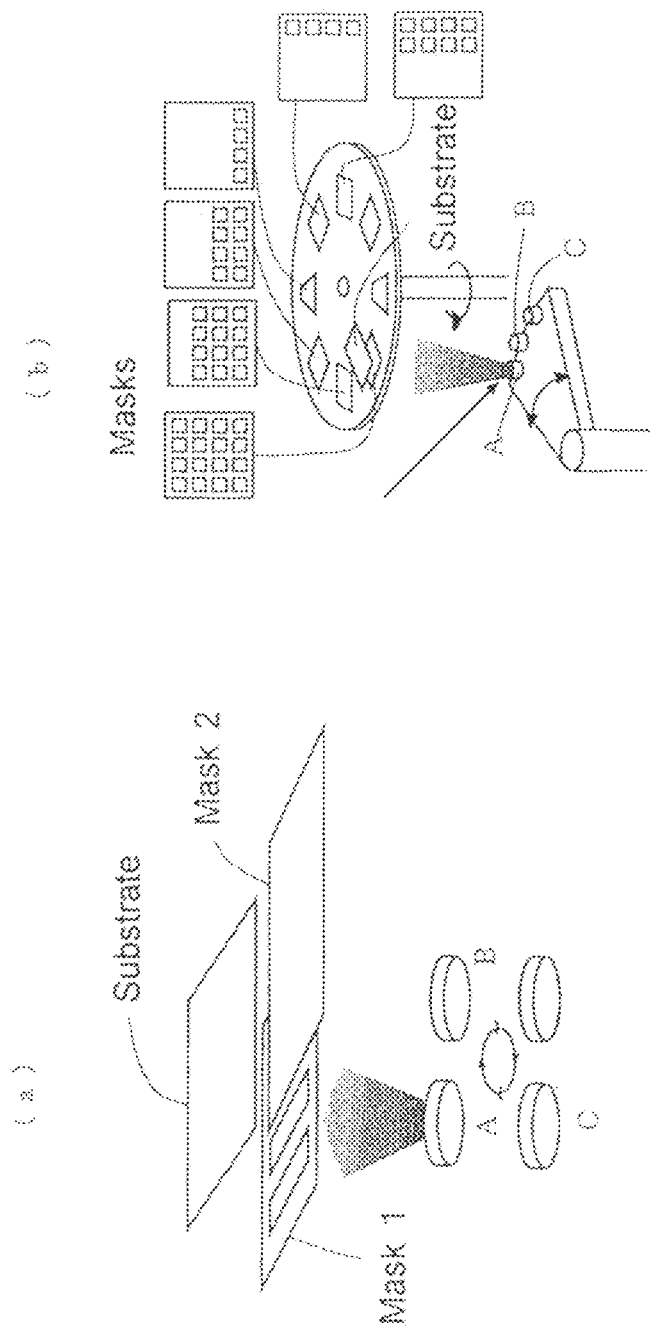
FIG. 22 schematically shows methods of investigating a binary or ternary material according to conventional combinatorial film forming arrangements.
Figure 23:
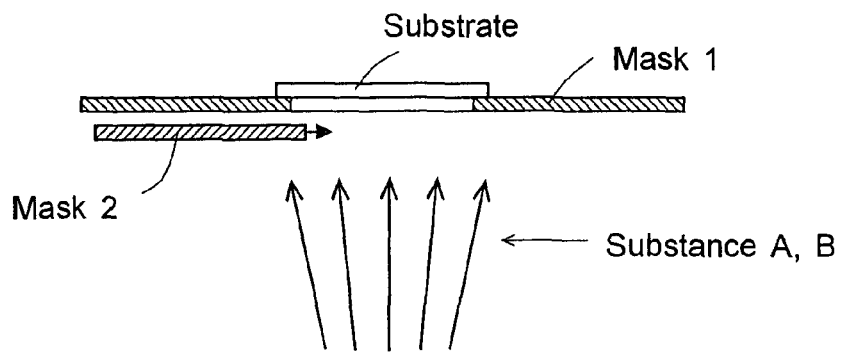
FIG. 23 schematically illustrates a conventional method of making a thin film of binary phase diagrammatic system.
Figure 23:
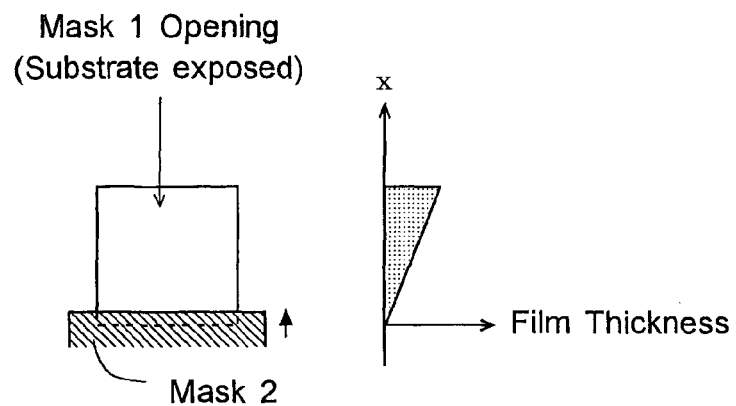
Figure 23:
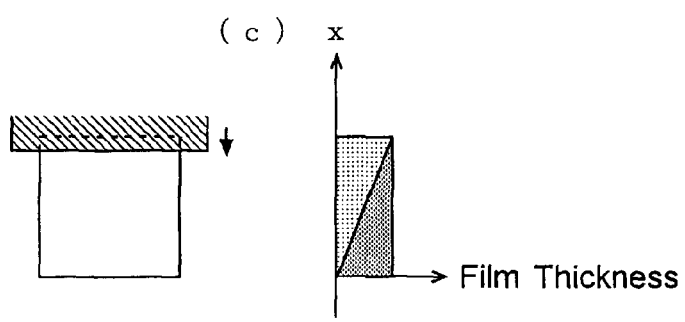

While in the preceding form of implementation the masking mechanism 50 is shown comprising the mask 51 movable linearly forth and back, it may alternatively comprise a disk type mask 53 moving rotationally. FIG. 21 is a plan view illustrating a modification of the masking mechanism of FIG. 19 in which the mask is constituted by a rotationally moving mask. In this case, the mask 53 comprises edges 53a, and edges 53b and 53c corresponding to the edges 52a and edges 52b and 52c previously described. Of them, the edges 53a extend inclined at an angle of +θ1 (=60°) to a circumferential direction in which the mask is rotationally moved, and the edges 53b and 53c extend inclined at angles of +θ2 and −θ2 to a circumferential direction, respectively. Here again, the edges 53a and the edges 53b and 53c have their respective lengths each of which is chosen to be enough long compared with the equilateral triangular region 12a of a substrate 12 on which a ternary phase diagrammatic thin film is to be formed. Further, it is desirable that the disk constituting the mask 53 have its diameter chosen large enough that changes in angular orientation of the single action edges 53a and the edges 53b and 53c with the rotation of the disk are minimum. In this case, too, the corrective operation of linear to polar coordinate conversion as in the first and second forms of implementation can be used to obtain a precision ternary phase diagrammatic thin film.

Although in the forms of implementations described above mention is made of the masking mechanisms as for an in-vacuum film forming apparatus such as a laser ablation vapor deposition apparatus, this should not be understood to be a limitation but it should be evident that the present invention is applicable to any film forming apparatus designed to form a thin film on a substrate by vapor phase growth.

As will be appreciated from the foregoing descriptions, a masking mechanism for a film forming apparatus according to the present invention can form a ternary phase diagrammatic thin film. Moreover, a masking mechanism for a film forming apparatus according to the present invention requires that it comprise a single mask and a means for uniaxially driving the mask and hence can be made extremely small in size and volume in order to be installed in a vacuum chamber while permitting a ternary phase diagrammatic thin film to be made without raising the equipment cost. Furthermore, the use of a masking mechanism according to the present invention makes it possible to make highly reliable binary and ternary phase diagrammatic thin films in a short period of time.

What is claimed is:

1. A method of making thin film using a masking mechanism, the masking mechanism comprising:
  a mask; and
  a means for moving the mask in one direction on a straight line above or beneath a substrate;
  wherein the mask has a periphery making an angle of $\alpha$ (where $0°<\alpha<90°$) to the straight line, and a first and a second openings,
  the first opening has a first edge making an angle of $30°+\alpha$ to the straight line,
  the second opening has a second edge making an angle of $-30°+\alpha$ to the straight line,
  the periphery, the first edge and the second edge are arranged along the one direction on the straight line, and
  further including the steps of:
  positioning the periphery of the mask immediately before a region of equilateral triangle where a thin film of ternary phase-diagrammatic system is to be formed in the substrate,
  moving the mask linearly in the same direction as the one direction, while a first material is evaporated so that the periphery forms a film-thickness gradient of the first material,
  moving the mask linearly and continuously in the same direction as the one direction, until the first edge of the mask is positioned immediately before the region of equilateral triangle where the thin film of ternary phase-diagrammatic system is to be formed in the substrate,
  moving the mask linearly in the same or opposite direction to the one direction, while a second material is evaporated so that the first edge of the mask forms a film-thickness gradient of the second material,
  moving the mask linearly and continuously in the same direction as the one direction, until the second edge of the mask is positioned immediately before the region of equilateral triangle where the thin film of ternary phase-diagrammatic system is to be formed in the substrate, and
  moving the mask linearly in the same or opposite direction to the one direction, while a third material is evaporated so that the second edge of the mask forms a film-thickness gradient of the third material.

2. A method of making thin film using a masking mechanism, the masking mechanism comprising:
  a mask; and
  a means for moving the mask in one direction on a straight line above or beneath a substrate;
  wherein the mask has a periphery orthogonal to the straight line, and a first and a second openings,
  the first opening has a first edge making an angle of $30°$ to the straight line,
  the second opening has a second edge making an angle of $-30°$ to the straight line,
  the periphery, the first edge and the second edge are arranged along the one direction on the straight line, and
  further including the steps of:
  positioning the periphery of the mask immediately before a region of equilateral triangle where a thin film of ternary phase-diagrammatic system is to be formed in the substrate,
  moving the mask linearly in the same direction as the one direction, while a first material is evaporated so that the periphery forms a film-thickness gradient of the first material,
  moving the mask linearly and continuously in the same direction as the one direction, until the first edge of the mask is positioned immediately before the region of equilateral triangle where the thin film of ternary phase-diagrammatic system is to be formed in the substrate,
  moving the mask linearly in the same or opposite direction to the one direction, while a second material is evaporated so that the first edge of the mask forms a film-thickness gradient of the second material,
  moving the mask linearly and continuously in the same direction as the one direction, until the second edge of the mask is positioned immediately before the region of equilateral triangle where the thin film of ternary phase-diagrammatic system is to be formed in the substrate, and
  moving the mask linearly in the same or opposite direction to the one direction, while a third material is evaporated so that the second edge of the mask forms a film-thickness gradient of the third material.

3. The method of making a film as set forth in claim 1 or 2, wherein
  the periphery has a length larger than a side of the region of equilateral triangle,
  the first opening has a size larger than the region of equilateral triangle, and
  the second opening has a size larger than the region of equilateral triangle.

4. The method of making a film as set forth in claim 1 or 2, wherein
  the first opening is arranged between the first edge and the second edge, and
  the second edge is arranged between the first and second opening.

* * * * *